United States Patent

Giles et al.

[11] 4,051,364
[45] Sept. 27, 1977

[54] PHOTOPARAMP ARRAY MULTIPLEXER

[75] Inventors: Michael K. Giles, China Lake; Myren L. Iverson, Ridgecrest, both of Calif.

[73] Assignee: The United States of America as represented by the Secretary of the Navy, Washington, D.C.

[21] Appl. No.: 712,456

[22] Filed: Aug. 6, 1976

[51] Int. Cl.$^2$ ............................................. H04D 9/00
[52] U.S. Cl. .................................. 250/199; 307/311; 307/88.3; 250/200; 330/4.9; 330/56
[58] Field of Search ............... 307/311, 88.3; 250/200, 250/216 R, 199; 328/2; 330/4.9, 56

[56] References Cited

U.S. PATENT DOCUMENTS

| | | | |
|---|---|---|---|
| 3,604,936 | 9/1971 | Kompfner | 250/199 |
| 3,772,528 | 11/1973 | Anderson | 330/4.9 |
| 3,808,435 | 4/1974 | Bate | 328/2 |

*Primary Examiner*—Robert L. Griffin
*Assistant Examiner*—Edward L. Coles
*Attorney, Agent, or Firm*—R. S. Sciascia; Roy Miller

[57] ABSTRACT

A photoparamp array multiplexer to provide photoparametric amplification in an array of photodiode diodes connected in parallel which essentially eliminates the need for an array of preamplifiers.

2 Claims, 3 Drawing Figures

PHOTOPARAMP ARRAY MULTIPLEXER

BACKGROUND OF THE INVENTION

1. Field of the Invention

The principal of photoparametric amplification has been applied to arrays of photodiodes, primarily silicon photodiodes. A problem arises however, in applying this principal to photodiode arrays in which the diodes are formed on a common substrate in that they require a common cathode.

In such case, pumping the photodiode simultaneously makes it impossible to determine from which diode a mixed signal originates.

2. Description of the Prior Art

FIG. 1 illustrates the basic photoparamp circuit. An intensity-modulated light signal is mixed with the pump frequency in the photodiodes, producing sum and difference signals at the output of the demodulator. The original signal frequency, amplified, is then recovered at the output of the demodulator.

SUMMARY OF THE INVENTION

The present invention is directed to pump multiplexing circuits which use a single local oscillator, a multiplexer and a single synchronous demodulator to transform an array of photodiodes into an array of photoparametric amplifiers. Use of the photoparamp array multiplexer provides an advantage for large arrays of photodiodes because it essentially eliminates the need for an array of preamplifiers associated with the photodiodes.

The technique also offers a potential increase in sensitivity since photoparametric amplification is essentially a noiseless process.

DESCRIPTION OF THE PREFERRED EMBODIMENT

Figure 1:
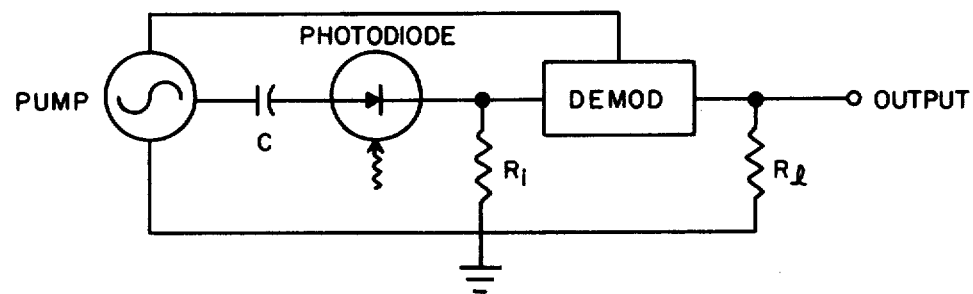
FIG. 1 is a block diagram of a basic photoparamp circuit.
Figure 2:
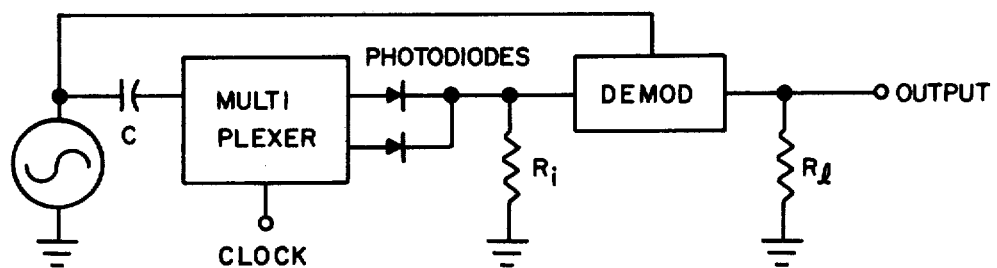
FIG. 2 is a block diagram of the pump multiplexing circuit of the present invention.

FIG. 2 illustrates how the pump circuit may be multiplexed into a photodiode array, thus allowing photoparametric amplification to occur within only one photodiode at a time. The configuration shown in FIG. 2 incorporates a pump which provides a predetermined output voltage at a specific frequency which is inputted through a coupling capacitor to a multiplexer. The output of the multiplexer is coupled to the inputs of each of the respective diodes in the array and the outputs of the diodes are connected in common to the input of the demodulator.

The multiplexer is actually a quad bilateral switch and the photodiodes were silicon diodes; however, it may be possible to substitute indium antimonide photodiodes. The demodulator is a synchronous demodulator and provides an output across the load resistor $R_L$.

Figure 3:
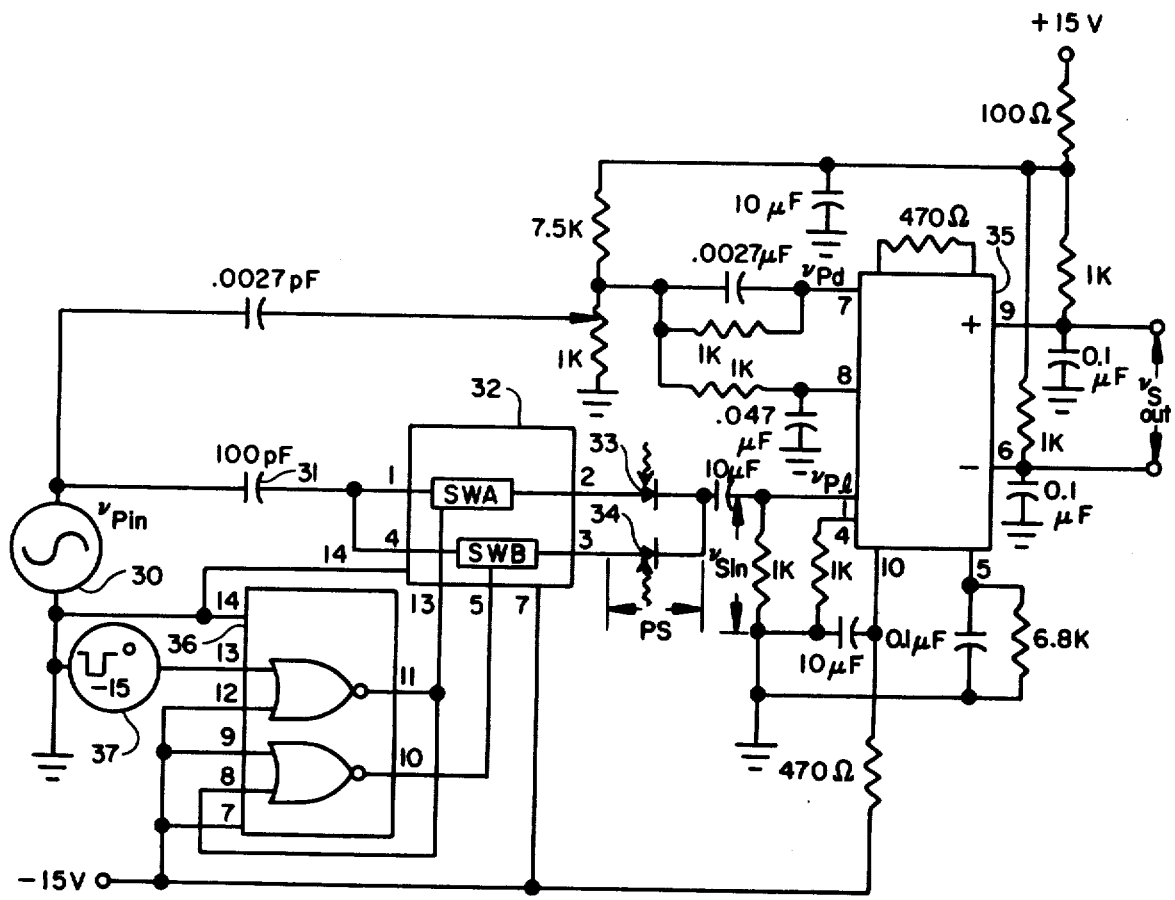
FIG. 3 is a detailed schematic of one embodiment of the present invention.

The detailed circuit schematic is shown in FIG. 3 wherein a pump 31 outputs a voltage $v$ pin at a reference frequency which is coupled through a capacitor 30 to the input of the multiplexer 32. The multiplexer 32 was actually an RCA quad bilaterial switch CD 4016A. The output of the multiplexer is coupled as individual inputs to photodiodes 33 and 34 which have their cathodes connected in common. The output signal from the photodiodes is coupled to a demodulator 35 which in this instance was a Motorola MC 1596 demodulator.

The multiplexer 32 is controlled by a clock 36 comprising a RCA CD 4001A which in turn is controlled by the output of a square wave generator 37.

The circuit was tested under the following input conditions:

$$v_{P_{in}} = 4 \text{ v } p-p,$$

$$v_{p\, diode} = 2v\, p-p$$

$$v_{pl} = 200 \text{ mv, and}$$

$$v_{p\, demod} = 500 \text{ mV rms}$$

The input to the photodiodes was obtained from an intensity-modulated light emitting diode (ME 60 from Monsanto). The frequency modulation was 1 to 2KHZ and the $p-p$ power from the light emitting diode incident on the photodiode is 2 microwatts $p-p = p_s$. The signal into the demodulator $v_{S_{in}} = 1$ millivolt $p-p$ across the 1K load with the photodiode reverse biased to $-1$ volt. The output signal from the demodulator with the above input conditions was $v_{s_{out}} = 20$ millivolts $p-p$. The gain in the demodulator is 2 therefore, photoparametric gain is $G_v = 10$ (20 db).

This is substantial gain even though slightly less than that obtained with a single photodiode and no multiplexing circuitry. The principal advantage lies in the fact that use of multiplexing essentially eliminates the need for an array of preamplifiers equal in number to the number of photodiodes. Each photodiode in the photoparamp array multiplexer is its own preamp.

Any number of photodiodes in an array can be pumped by means of a single oscillator and all photodiode outputs can be demodulated with a single balanced demodulator. Ideally also, the technique will eliminate cross talk between channels.

What is claimed is:

1. A photoparamp array multiplexer comprising;
   pump means for outputting pump energy at a predetermined frequency;
   an array of photodiodes connected in parallel and having an input for receiving a modulated light signal, and outputs;
   multiplexing means operatively connected between the output of said pump means and the input to each of said photodiodes;
   demodulating means operatively connected to the outputs of the photodiodes and having an output therefrom corresponding to the output signal of the photodiodes;
   a multiplexing pulse input operatively coupled to said multiplexing means to cause said multiplexing means to couple the output of said pump means to the input of each of said photodiodes one at a time;
   whereby the output of said demodulating means corresponds to the amplified output of an individual photodiode as determined by said multiplexing means.

2. A photoparamp array multiplexer as set forth in claim 1 wherein;
   said multiplex means comprises an array of switches having inputs and an output wherein the output of an individual switch is connected to the input of a individual photodiode;
   said pump means being connected to one of said inputs to said switch array; and
   logic means having an output connected to another of said inputs of said switching means to control the on/off of said switching array.

* * * * *